United States Patent [19]

Zucker

[11] Patent Number: 5,689,822
[45] Date of Patent: Nov. 18, 1997

[54] WIRELESS COUPLED ADAPTER FOR DECODING INFORMATION FROM A BROADCAST SIGNAL TO WHICH A RADIO IS TUNED

[76] Inventor: Leo Zucker, 2591 Dunning Dr., Yorktown Heights, N.Y. 10598

[21] Appl. No.: 390,685

[22] Filed: Feb. 17, 1995

[51] Int. Cl.$^6$ .................................................. H04B 1/38
[52] U.S. Cl. .................... 455/89; 455/145; 455/151.3; 455/152.1; 455/179.1; 455/345; 455/347; 455/351
[58] Field of Search .................. 455/89, 90, 344, 455/345, 346, 347, 348, 349, 351, 11.1, 88, 38.4, 145, 150.1, 151.1, 151.2, 151.3, 152.1, 186.1, 185.1, 179.1

[56] References Cited

U.S. PATENT DOCUMENTS

| | | |
|---|---|---|
| 4,577,220 | 3/1986 | Laxton et al. . |
| 4,706,273 | 11/1987 | Spear et al. ..................... 379/58 |
| 4,718,106 | 1/1988 | Weinblatt . |
| 4,723,302 | 2/1988 | Fulmer et al. . |
| 4,803,487 | 2/1989 | Willard et al. ..................... 455/8 |
| 5,063,610 | 11/1991 | Alwadish . |
| 5,214,792 | 5/1993 | Alwadish . |
| 5,239,540 | 8/1993 | Rovira et al. . |
| 5,276,918 | 1/1994 | Cornforth et al. ............ 455/89 |
| 5,289,271 | 2/1994 | Watson . |
| 5,422,733 | 6/1995 | Merchant et al. ............ 455/38.4 |

FOREIGN PATENT DOCUMENTS 5191332  7/1993  Japan ..................... 455/345

OTHER PUBLICATIONS

United States RBDS Standard, Jan. 8, 1993, pp. 1–6.
RDS Demodulator type SAF7579, Philips Application Brochure 9397 251 10142 (Feb. 1990).
Graf et al, Video, Stereo and Optoelectronics, pp. 205, et seq. (1990).

*Primary Examiner*—Reinhard J. Eisenzopf
*Assistant Examiner*—Doris To
*Attorney, Agent, or Firm*—Leo Zucker

[57] ABSTRACT

A wireless adapter for decoding information from a broadcast signal to which a radio is tuned. The radio emits a local signal that serves to identify the broadcast signal, and a coupling part in the vicinity of the radio responds to the local signal. The coupling part produces a tuning signal in response to the local signal, and the tuning signal is applied to an adapter receiver circuit so that the receiver circuit acquires the broadcast signal to which the radio is tuned. A decoder circuit then decodes information contained in the acquired broadcast signal. In one embodiment, the adapter can be mounted in a vehicle near the vehicle radio. When the radio is tuned to a station that encodes, e.g., RBDS radio text on a sub-carrier of its broadcast signal, the adapter will acquire the station's sub-carrier, and will display the text conveniently and safely.

20 Claims, 4 Drawing Sheets

FIG.5

WIRELESS COUPLED ADAPTER FOR DECODING INFORMATION FROM A BROADCAST SIGNAL TO WHICH A RADIO IS TUNED

BACKGROUND OF THE INVENTION

1. Field of the Invention

The present invention relates to an adapter that augments existing broadcast receiver performance. The adapter detects encoded broadcast information which can not be detected by the receiver alone. More particularly, the present invention comprises a technique and apparatus for enabling owners of existing broadcast receivers, including but not limited to automobile FM radios, to detect information encoded on broadcast carrier signals to which the receivers are tuned.

2. Description of the Known Art

Adapters or converters are known which enable existing radio or television (TV) receivers effectively to increase the frequency range over which they can be tuned. Such converters must be hard-wired to an existing receiver between an antenna lead or a cable, and a corresponding radio frequency (RF) input terminal of the receiver. An example of such a converter is the familiar cable TV channel selector unit, for use with TV receivers that are not "cable ready". The cable TV converters operate to convert a selected cable channel to a certain VHF channel (e.g., TV channel 3 or 4) to which the viewer's TV receiver is preset. In the case of cable TV programs that are "scrambled", the converter may include appropriate descrambling circuitry for those viewers who pay a premium to the cable system operator.

The All Channel Receiver Act of 1962, 47 U.S.C. § 303(s), requires television receivers sold in the United States to include UHF tuners. Until then, UHF to VHF converters were used to enable programs broadcast over the UHF TV channels (then 14 to 83) to be selected and converted to a preset VHF channel. Owners of the many existing VHF-only TV sets were then able to enjoy reception of broadcast UHF programs, by connecting the converter between a UHF TV antenna, and the VHF antenna input terminals of their TV set which was left tuned to the preset VHF channel (usually channel 3 or 4).

In the radio broadcasting spectrum, special converters allow owners of standard AM radios to listen to shortwave radio broadcasts. A suitable shortwave receiving antenna is connected to the converter, and received shortwave carrier signals are converted to a frequency within the standard AM radio band. Like the cable and the UHF-VHF converters mentioned above, shortwave radio converters must be connected by wire or cable to an existing receiver for proper operation.

It is also known to provide apparatus that determines the channel to which an existing TV receiver is tuned, by coupling the apparatus with a local oscillator (LO) signal produced in the TV receiver and processing the detected LO signal. See U.S. Pat. Nos. 4,577,220 (Mar. 18, 1986); 4,723,302 (Feb. 2, 1988); and 5,289,271 (Feb. 22, 1994). The patented apparatus do not serve to augment or to enhance the performance of existing TV receivers, however.

On Jan. 8, 1993, a North American Radio Broadcast Data System (RBDS) Standard was adopted in the United States. The American RBDS Standard applies to FM sound broadcasts in the range of 87.5 MHz to 108.0 MHz, carrying either stereophonic or monophonic programs. See United States RBDS Standard, Draft 2.0, available from the National Association of Broadcasters, Washington, D.C.

When broadcasting under the RBDS Standard, a 57-kHz subcarrier is added to the main program carrier signal, and source data is digitally encoded on the subcarrier for multiple purposes. For example, program type (PTY) source data identifies the type of program transmitted, including Jazz, Classic Rock, Oldies, Country, News and Information, Children, Sports, Talk, Emergency, and the like. Persons wanting to listen only to specific types of programs can set the desired PTY codes in suitably equipped FM receivers, and the receivers will then selectively seek and play only those stations which transmit the types of programs desired to be heard. The broadcast subcarrier is amplitude modulated by a shaped and biphase coded data signal, and the subcarrier is suppressed. The modulation method may be considered a form of two-phase shift keying (PSK), with a phase deviation ±90 degrees. A basic clock frequency is derived by dividing the transmitted subcarrier frequency by 48, so that the basic data rate of the system is 1187.5 bits per second.

Source data at the transmitter may also include displayable textual characters, referred to in the RBDS Standard as Radiotext (RT). The data is differentially encoded in a manner such that when the input data level is binary zero, the output stays unchanged from the previous output bit level and, when an input binary one level occurs, the new output bit is the compliment of the previous output bit. At the receiver, data is decoded by the inverse process.

Most persons spend a good deal of time in their automobiles while commuting, shopping, or driving a family member from one place to another. Most all automobile radios now in service are capable of receiving the FM broadcast band using either analog or digital tuning technology. Commercial radio broadcasters therefore have an ongoing opportunity to communicate with the general public while they travel on the road. But existing FM radios have no means for decoding and displaying RBDS radiotext transmissions. Also, relatively few FM broadcasters are sending RBDS source data on the 57-kHz subcarrier, and receivers equipped to respond to such data are not widely available for either home or automobile use. Further, FM broadcast stations that now transmit radiotext usually limit the text to station call letters or a popular station name, e.g., "Z-100".

U.S. Pat. Nos. 5,063,610 (Nov. 5, 1991) and 5,214,792 (May 25, 1993) disclose broadcasting systems having supplemental data transmission and storage. For example, listeners with receivers constructed according to the patents can identify and store the title of a broadcast musical piece as it is played, or they can view and store text relating to an advertisement.

SUMMARY OF THE INVENTION

An object of the invention is to provide an adapter for augmenting the reception capabilities of existing broadcast receivers.

A further object of the invention is to provide an adapter and a method whereby the adapter augments the reception capabilities of existing receivers without connecting wires or cables.

Yet another object of the invention is to provide an adapter and method that will allow listeners to enjoy a new radio broadcasting service with their present receivers, whether at home or in an automobile.

Another object of the invention is to provide an adapter that can be used safely in an automobile to detect and display encoded broadcast information.

A further object of the invention is to provide an adapter that can be used safely in an automobile to detect and display encoded broadcast information, wherein the adapter need not be connected by wire or cable to the automobile radio.

Another object of the invention is to provide an adapter that can be mounted safely in a vehicle, without distracting the driver's attention from the road.

According to the invention, a method of decoding information contained in a broadcast signal to which a radio receiver is tuned, comprises placing coupling means in the vicinity of a radio receiver that is tuned to a broadcast signal, wherein information is encoded in part of the signal. A local signal, emitted from the radio receiver when tuned to the broadcast signal, serves to identify the broadcast signal. The local signal is detected by the coupling means, and a tuning signal is produced in accordance with the local signal. The tuning signal is applied to an adapter receiver circuit, causing the receiver circuit to acquire the part of the broadcast signal in which information is encoded. Information is then decoded from the acquired part of the broadcast signal.

According to another aspect of the invention, a wireless adapter for decoding information contained in part of a broadcast signal to which a radio receiver is tuned, comprises coupling means for detecting a local signal emitted from a radio receiver in the vicinity of the coupling means, wherein the local signal serves to identify the broadcast signal to which the radio receiver is tuned, and means for producing a tuning signal in accordance with the local signal. Receiver circuit means responsive to the tuning signal acquires the part of the broadcast signal in which information is encoded, and decoder means coupled to the receiver circuit means decodes information contained in the acquired part of the broadcast signal.

For a better understanding of the present invention, together with other and further objects, reference is made to the following description taken in conjunction with the accompanying drawing, and the scope of the invention will be pointed out in the appended claims.

DETAILED DESCRIPTION OF THE INVENTION

Figure 1:
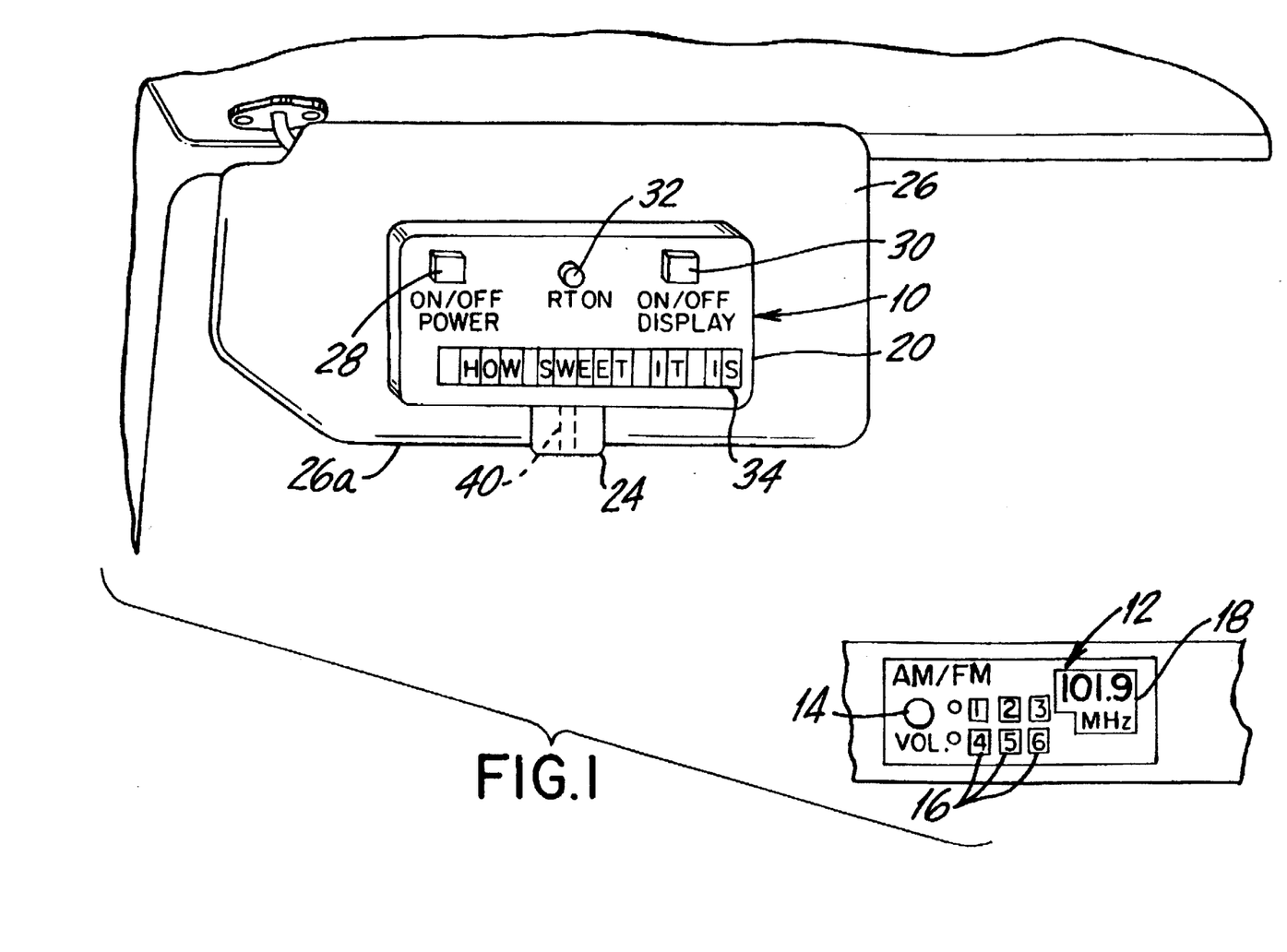
FIG. 1 is a partial view from a driver's position, looking in a forward direction of a vehicle in which the present adapter is mounted on a sun visor.

FIG. 1 is a view taken from a driver's position inside a vehicle, showing an adapter 10 according to the invention, and a conventional vehicle radio 12 within the driver's reach. The vehicle radio 12 may be a conventional AM/FM car radio having an ON/OFF volume control 14, a set of station selector buttons 16, and a station frequency digital display 18. The adapter 10 has a panel portion 20 shown in FIG. 1, and a rear coupling/antenna portion 22 shown in FIG. 2.

Figure 2:
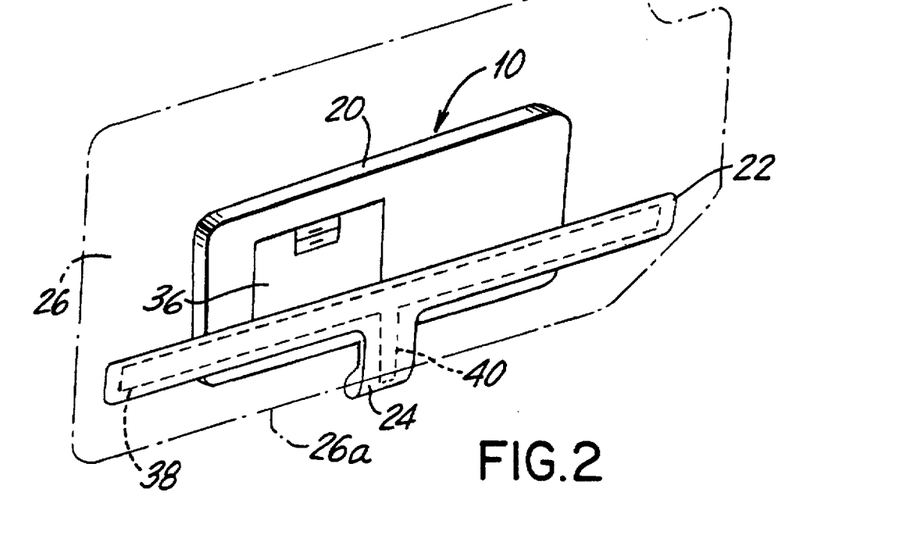
FIG. 2 is a perspective view of the adapter as seen from the back in FIG. 1.

The panel portion 20 is joined with the rear portion 22 by a "U" clamp portion 24 that may be formed together with parts of panel portion 20 and rear portion 22. The "U" clamp portion 24 is dimensioned to clasp an edge part 26a of an automobile sun visor 26, when the adapter 10 is mounted on the sun visor 26. The clamp portion 24 exerts a clamping force sufficient to keep the entire adapter 10 in place on the sun visor 26. Examples of materials suitable to form casings for the panel and the rear portions 20, 22, and the "U" clamp portion 24, include non-conductive plastics materials commonly used in the manufacture of consumer electronics equipment.

The adapter 10 has on the panel portion 20, an ON/OFF power switch 28, an ON/OFF display switch 30, a radiotext (RT) ON lamp 32, and a text character display 34. The display 34 is conventional, for example, a 16-character liquid crystal display with provision for lighting to aid viewing at night. Alternatively, the display 34 may include active light emitting elements if sufficient power is available.

A removable battery access door 36 is situated on the back of the panel portion 20, as seen in FIG. 2. Access door 36 is opened by sliding the door 36 off the back of the panel portion 20, to allow insertion or replacement of a battery power source for the adapter 10. For example, adapter 10 may be powered by a standard 9-volt battery, or by a rechargeable Nicad battery pack. In the latter case, a separate battery charging transformer can be connected to a battery charger socket (not shown) on the panel portion 20, for the purpose of recharging the battery pack.

The rear coupling/antenna portion 22, shown in FIG. 2, is in the form of an elongate strip joined at its center to a leg of the U clamp portion 22, to extend along the edge part 26a of the sun visor 26. A dipole antenna 38 is protectively enclosed over the length of the rear portion 22. Antenna 38 may, e.g., be a folded dipole made from a determined length of balanced transmission line. A feed point 40 of the antenna 38 is connected with a balanced transmission line to circuitry inside panel portion 20, through the clamp portion 24 (see FIGS. 1 and 3).

It has been discovered that conventional broadcast receivers radiate continuous local oscillator (LO) signals that can be detected some distance away. For the vehicle FM radio 12, a LO signal can be detected at least as far as the sun visor 26. Broadcast FM radios in the United States typically produce an internal LO signal at a frequency 10.7 MHz higher than the broadcast frequency to which the radio 12 is tuned. For example, if the radio 12 is tuned to receive a FM station broadcasting at a frequency of 101.9 MHz, the radio produces an internal LO signal at 112.6 MHz for the purpose of mixing with a received broadcast carrier signal at 101.9 MHz. An intermediate frequency (IF) signal, whose frequency (10.7 MHz) is the difference between the LO signal frequency and the broadcast frequency to which the radio 12 is tuned, is produced by a mixing circuit in the radio. Program sound modulated on the broadcast carrier signal is then detected from the 10.7 MHz IF signal and reproduced by the radio 12. As mentioned, the LO signal at 112.6 MHz is simultaneously radiated from the radio 12.

If the radio 12 is tuned to receive a broadcast carrier signal at 87.9 MHz (the lower end of the FM broadcast band), the LO signal produced and radiated by the radio 12 is at 98.6 MHz. If the radio 12 is tuned to the upper FM broadcast band limit at 107.9 MHz, it will radiate a LO signal at a frequency of 118.6 MHz. The present adapter 10 uses to advantage the fact that radio 12 radiates the LO signal over a certain distance from the radio, and that the LO signal is always 10.7 MHz higher than the broadcast frequency to which the radio is tuned. That is, the frequency of the LO signal radiated from radio 12 varies in a known manner as the radio is tuned across the FM broadcast band. See FIG. 5.

Figure 3:
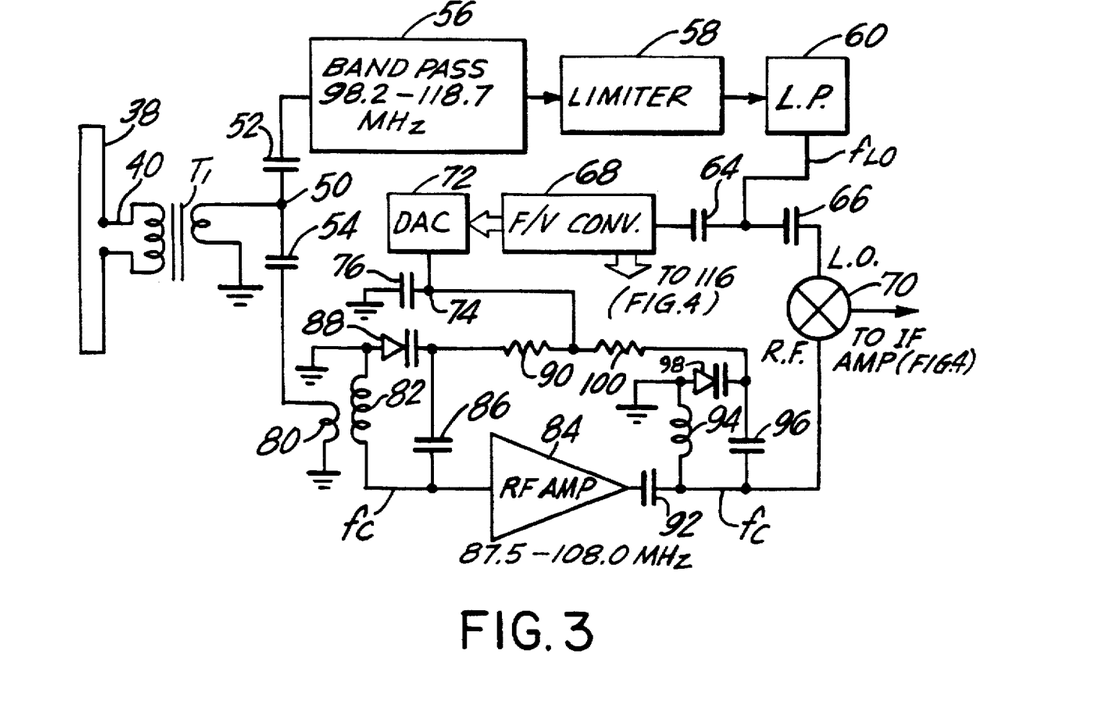
FIG. 3 is a schematic block diagram showing radio frequency tuning stages in the adapter.

FIG. 3 is a schematic block diagram of RF amplifier and mixer stages contained in the panel portion 20.

Antenna 38 is connected by transmission line 40 through the clamp portion 24, to a balanced winding of a balun transformer T1 contained in the panel portion 20. An unbalanced winding of the transformer T1 is grounded at one side, and connected at the other side to a node 50 to which terminals of capacitors 52 and 54 are also connected. The other terminal of capacitor 52 is connected to an input of a RF bandpass filter 56 which has a pass band of from about 98.2 MHz to 118.7 MHz. An output of the bandpass filter 56 is connected to an input of a limiter stage 58. The limiter stage 58 provides a very high amplification factor for signals output from the bandpass filter 56 within the mentioned range of 98.2 MHz to 118.7 MHz.

An output of the limiter stage 58 is connected to an input of a low pass (L.P.) filter 60 the cut-off frequency of which is above the upper frequency limit of the bandpass filter 56, e.g., just above 118.7 MHz. An output of the low pass filter 60 is connected to a node 62 to which terminals of capacitors 64 and 66 are also connected. The other terminal of capacitor 64 is connected to an input of a frequency-to-voltage converter stage 68, and the other terminal of capacitor 66 is connected to a local oscillator (LO) input terminal of a mixing stage 70. In one embodiment, the converter stage 68 may include a frequency counter operative up to at least 118.7 MHz, and the stage is coupled with a controller 116 as described below in connection with FIG. 4.

An output of the frequency/voltage converter stage 68 is connected to an input of a digital-to-analog converter (DAC) stage 72, and an output of DAC stage 72 is connected to a tuning voltage node 74. A DC smoothing capacitor 76 is connected between the tuning voltage node 74 and ground.

The other terminal of the capacitor 54 is connected to one side of a primary winding 80 forming part of a tuned antenna input circuit. The other side of winding 80 is grounded. A secondary winding 82 of the tuned antenna circuit is also grounded at one side, and the other side of winding 82 is connected to an input of a radio frequency (RF) amplifier stage 84. The useful frequency response of RF amplifier stage 84 includes the FM broadcast band of 87.5 MHz to 108.0 MHz.

A fixed capacitor 86 has one terminal connected to the input of RF amplifier stage 84, and the other terminal of capacitor 86 is connected to the cathode side of a varactor tuning diode 88. The anode side of the tuning diode 88 is connected to the grounded side of the input circuit secondary winding 82. One terminal of a resistor 90 is connected to the cathode side of the diode 88, and the other terminal of resistor 90 is connected to the tuning voltage node 74.

An output of RF amplifier stage 84 is coupled through a capacitor 92 to one side of a tuned output circuit winding 94. The other side of winding 94 is grounded. A fixed capacitor 96 has one terminal connected to the ungrounded side of winding 94, and the other terminal of capacitor 96 is connected to the cathode side of a varactor tuning diode 98. The anode side of tuning diode 98 is connected to the grounded side of the output circuit winding 94. One terminal of a resistor 100 is connected to the junction point between capacitor 96 and tuning diode 98, and the other terminal of resistor 100 is connected to the tuning voltage node 74. The output of RF amplifier stage 84 is also coupled through the capacitor 92 to a RF input terminal of the mixing stage 70. An intermediate frequency (IF) output of the mixing stage 70 is coupled to an input of a 10.7 MHz IF filter and amplifier stage 102 shown in FIG. 4.

Figure 4:
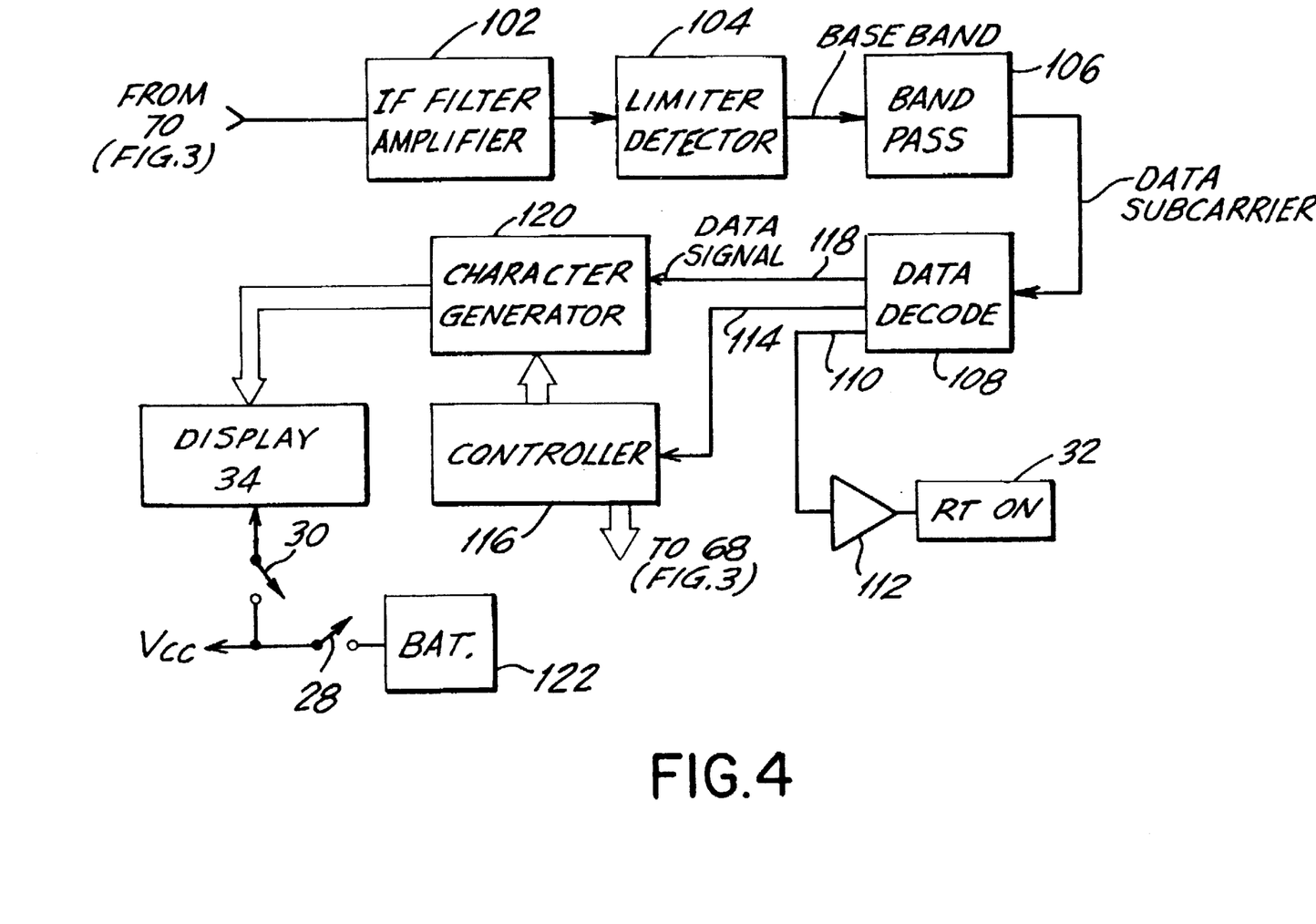
FIG. 4 is a schematic block diagram showing information decoding and display stages in the adapter.

IF filter/amplifier stage 102 may comprise one or more conventional 10.7 MHz IF filter/amplifier stages such as used in existing FM broadcast radio circuits. For example, stage 102 may include two solid state transistor amplifiers each with a 10.7 MHz ceramic filter at its input and output terminals. IF filter/amplifier stage 102 may itself reside on a single integrated circuit (IC) chip together with other circuitry forming the present adapter 10.

An output of the IF filter/amplifier stage 102 is coupled to an input of a limiter/detector stage 104. Stage 104 may also be a conventional limiter/detector stage of the kind used in FM broadcast receivers. The stage performs the operations of limiting, and of detecting modulation with respect to an IF signal output from IF filter/amplifier stage 102. A baseband signal output from the limiter/detector stage 104 is then filtered by stage 106 to pass only the range of frequencies in which information to be decoded is present. For example, for RBDS applications, filter stage 106 has a center bandpass frequency of 57 kHz. An output of filter stage 106 is coupled to an input of a data decode stage 108.

The data decode stage 108 may be in the form of a conventional IC digital decoder chip. For example, in RBDS applications, stage 108 may be a type SAF7579 RBDS demodulator available from Philips Semiconductor, Sunnyvale, Calif. The data decode stage 108 operates to demodulate data, including radiotext, which may be encoded on the filtered baseband signal from the filter stage 106. The presence of a 57 kHz data encoded signal at the input of the decode stage 108, may be signaled at an output terminal 110 to drive the RT ON lamp 32 on the panel portion 20, via a lamp driver circuit 112. Data decode stage 108 may also provide a decoding clock signal at an output terminal 114. In the case of the mentioned type SAF7579 device, the clock signal is at the frequency of 1187.5 Hz and can be used to control subsequent radio text decoding circuitry in the adapter 10 as prescribed by the RBDS Standard. Further details relating to the type SAF7579 device may be found in Philips Application Brochure 9397 251 10142 (Feb. 1990).

The clock signal from data decode stage 108 is input to a controller 116, which serves to control the timing of operations carried out by other components of the apparatus 10, including the frequency/voltage converter stage 68 in FIG. 3. For example, the controller 116 may be a conventional microprocessor provided in the usual configuration with one or more read-only-memories (ROMs) in which an operating program and other data for the adapter 10 are permanently stored; one or more random access memories (RAMs), and various input-output (I-O) devices as may be necessary to interface the controller 116 with other components of the adapter 10.

The data decode stage 108 provides a decoded data signal at output terminal 118. The decoded data signal may correspond to RBDS source data including radio text encoded on the 57 kHz signal output from the filter stage 106. The data signal is input to a conventional character generator 120 which operates to translate the data signal, which may be in serial binary form, to a format suitable for driving the display 34 under the control of the controller 116. A display buffer (not shown) or other suitable interface can be provided between the character generator 120 and the display 34. As is known in the art, character generator 120 operates to convert the input serial binary text data signals into corresponding parallel text data signals for display.

As mentioned, the present adapter 10 is powered by a battery power source 122, and the source 122 is connected to components of the adapter 10 through ON/OFF power switch 28. The display 34 has an associated ON/OFF switch 30 which will disable the display 34 from being energized while remaining components of the adapter 10 remain operative.

Operation of the adapter 10 is carried out as follows.

The adapter 10 is clamped on the sun visor 26 or mounted safely elsewhere in a vehicle with the panel portion 20 facing the driver or passengers. The rear coupling/antenna portion 22 should be kept out of direct contact with metallic parts of the vehicle. The adapter 10 and the vehicle radio 12 are then turned on. The radio is tuned to a desired station and a corresponding LO signal originating from the radio will be coupled to the adapter 10 via the coupling/antenna portion 22. That is, antenna 38 will respond to the LO signal radiated from the vehicle radio and will provide a corresponding signal for tuning the adapter 10. The coupled LO signal is directed through transmission line 40, transformer T1, and capacitor 52 to the RF bandpass filter 56 shown in FIG. 3.

The coupled LO signal from the vehicle radio 12 is at a frequency that is always 10.7 MHz higher than the broadcast frequency to which radio 12 is tuned. Assuming, for example, that the radio is tunable between 87.5 MHz to 108.0 MHz, the coupled signal is in the passband of the adapter filter 56, viz. 98.2 MHz to 118.7 MHz. The coupled signal is applied to the limiter 58 and conditioned by the low pass filter 60, to produce an adapter tuning signal ($f_{LO}$) at the fundamental LO signal frequency. The adapter tuning signal is coupled by capacitor 66 to the LO input of the mixing stage 70 in FIG. 3, and thus serves in the adapter 10 as a local oscillator signal which is coherent with the LO signal produced internally of and radiated from the vehicle radio.

The adapter tuning signal is also coupled by capacitor 64 to the input of the frequency/voltage converter stage 68, the latter producing a digital frequency signal corresponding to the tuning signal frequency. The digital frequency signal is compared via controller 116 with a pre-set memory look-up table, and the frequency signal is converted to a corresponding digital tuning voltage signal. The digital tuning voltage signal is then converted via the DAC 72 to a DC tuning voltage at node 74. The DC tuning voltage at node 74 is then applied via resistors 90, 100 to the tuning varactor diodes 88, 98 of the tuned input and output circuits associated with RF amplifier stage 84. Thus, the DC tuning voltage at node 74 will vary with the frequency of the local tuning signal, in a manner set by the frequency/voltage converter stage 68, and the controller 116 with the mentioned look-up table.

Figure 5:
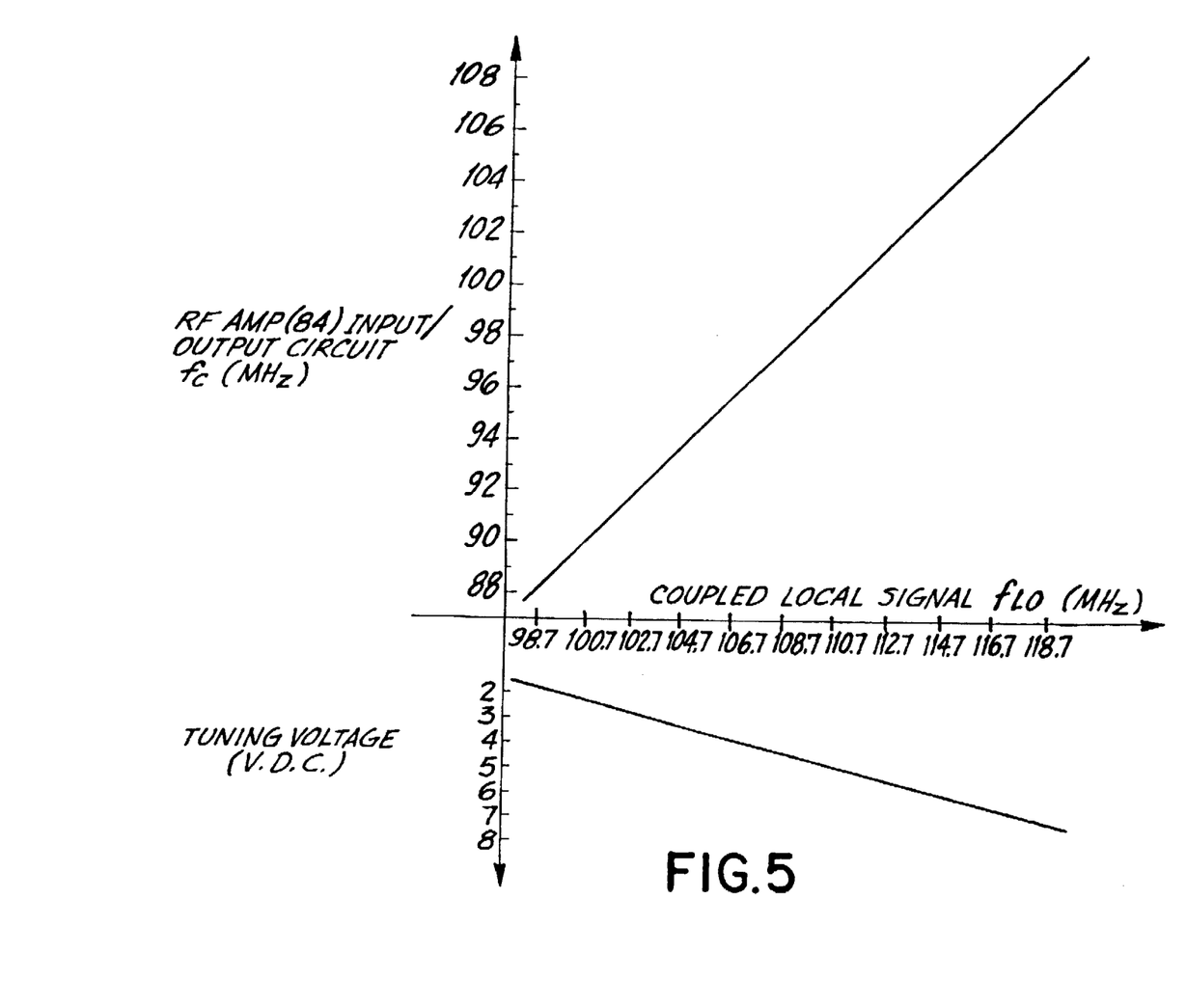
FIG. 5 is a graph showing relationships between signal frequencies and a tuning voltage in the stages of FIG. 3.

As shown in FIG. 5, the DC tuning voltage applied to the tuning varactor diodes 88, 98 is defined so that both of the input and output circuits of RF amplifier stage 84 will be resonant to a broadcast carrier signal of a frequency that is 10.7 MHz lower than the frequency of the local tuning signal. RF amplifier stage 84 is therefore tuned to respond optimally to the same broadcast carrier signal as that to which the vehicle radio 12 is tuned, without the need of any manual tuning of the adapter 10. If typical varactor diodes (e.g., type MV2107) are used in the input and output tuned circuits of RF amplifier stage 84, the tuning voltage needed to resonate the circuits at 87.9 MHz is, for example, about 2.0 volts DC. Thus, if the frequency/voltage converter stage 68 determines that the local tuning signal frequency is 98.6 MHz, the look-up table associated with controller 116 will define a corresponding tuning voltage of 2.0 volts DC to be applied to the diodes 88, 98 via DAC 72 and resistors 90, 100. The input and output circuits of the RF amplifier stage 84 will then be resonant to a carrier signal at a frequency of 87.9 MHz (98.6 MHz–10.7 Mhz).

The tuning voltage needed to resonate the input and output circuits of RF amplifier stage 84 at 107.9 MHz using typical devices for varactor diodes 88, 98; is for example about 7.5 volts DC. Thus, if the frequency/voltage converter stage 68 determines that the local tuning signal frequency is 118.6 MHz, the look-up table associated with controller 116 will define a corresponding tuning voltage of 7.5 volts DC to be applied to the diodes 88, 98 via DAC 72 and resistors 90, 100. The input and output circuits of the RF amplifier stage 84 will then be resonant to a carrier signal at a frequency of 107.9 MHz (118.6 MHz–10.7 Mhz).

The tuning voltages needed to resonate the input and output circuits of RF amplifier stage 84 at frequencies between 87.9 and 107.9 MHz increase, for example, substantially linearly from 2.0 VDC to 7.5 VDC as shown in FIG. 5. Optimum tuning voltages for selected broadcast frequencies across the FM radio band may also be determined experimentally, once all components of the stage 84 are assembled. The look-up table or other conventional conversion means associated with the frequency/voltage converter 68, may then be programmed or set to provide the optimum tuning voltage for each selected broadcast frequency.

Antenna 38 is arranged to respond to broadcast carrier signals over the entire FM radio broadcast band, including the carrier signal to which the vehicle radio 12 is tuned. The same broadcast signal which carries a program being heard over the vehicle radio is therefore selected by the adapter for further processing by operation of the tuning signal circuitry of FIG. 3. The broadcast carrier signal is amplified via the stage 84 and applied as a RF input signal to the mixing stage 70. Because the tuning signal input to the LO terminal of the mixing stage 70 is 10.7 MHz higher in frequency than the amplified broadcast carrier signal, the output of the mixing stage 70 is an IF signal at a frequency of 10.7 MHz. The adapter IF signal has all the information, including encoded text data, that is modulated on the broadcast carrier signal to which vehicle radio 12 is tuned.

The present adapter 10 augments the operation of an existing broadcast receiver by decoding and displaying text data encoded on the broadcast signal to which the receiver is tuned. No wires or cables need be connected between the receiver and the adapter to enable the adapter to (1) track the broadcast frequency to which the receiver is tuned, (2) receive the same broadcast carrier signal received by the radio, and (3) decode information encoded in the carrier signal. The adapter 10 allows radio listeners an opportunity to enjoy a new broadcasting service using their present radio receivers, whether at home or in their automobiles.

Although reference is made to radio text data transmitted over a subcarrier of a broadcast radio program, one skilled in the art will appreciate that the present invention is not limited to such applications. That is, the adapter 10 may be configured to demodulate text data encoded in accordance with any present or future established standard, or any other kind of information including but not limited to encoded graphic or facsimile images. Although a single line display 34 is shown on the panel portion 20 of the adapter 10 for purposes of driver safety, multiple lines of text may be displayed simultaneously if the adapter is constructed for use with table-top or portable receivers.

In addition to, or instead of providing the display 34, adapter 10 may include memory circuitry for enabling the decoded information to be stored for later retrieval. See the mentioned U.S. Pat. Nos. 5,063,610 and 5,214,792. Instead of displaying song titles or advertisements, the adapter 10 may display other messages of interest, e.g., paging messages encoded on a broadcast station carrier to which an associated broadcast receiver is tuned. Display 34 may also be one capable of producing high resolution graphic images so that both text characters and pictures can be reproduced.

Although the adapter 10 is disclosed for use with the vehicle FM radio 12, other configurations suitable for use with existing home or portable broadcast receivers, including television receivers, will be apparent to those skilled in the art.

While the foregoing description represents a preferred embodiment of the invention, it will be obvious to those skilled in the art that various changes and modifications may be made, without departing from the true spirit and scope of the invention as pointed out in the following claims.

What I claim is:

1. A method of decoding information transmitted in a broadcast carrier signal; comprising:

tuning a broadcast receiver to a selected broadcast carrier signal of a certain carrier frequency, the selected broadcast carrier signal having encoded information, the broadcast receiver radiating a local signal having a property capable of identifying said carrier frequency;

placing coupling/antenna means in the vicinity of the broadcast receiver for responding to said local radiated signal and to said selected broadcast carrier signal;

producing, from an output of the coupling/antenna means, a tuning signal corresponding to the local radiated signal;

selecting, according to said tuning signal, the broadcast carrier signal to which the broadcast receiver is tuned from an output of the coupling/antenna means; and decoding information encoded in the selected broadcast carrier signal and producing a corresponding decoded information signal.

2. The decoding method of claim 1, including coupling said coupling/antenna means to a local oscillator input terminal of a mixer circuit.

3. The method of claim 2, including producing an intermediate frequency (IF) output signal at an IF output terminal of the mixer circuit, and performing said decoding step by using said IF output signal.

4. A method of augmenting the operation of an existing broadcast receiver by decoding information contained in a broadcast signal to which the receiver is tuned, comprising:

placing coupling means in the vicinity of a broadcast receiver that is tuned to a broadcast signal having a given carrier frequency, said broadcast signal having certain information encoded in a part of the broadcast signal;

sensing with the coupling means a local signal that is emitted from the broadcast receiver, said local signal having a predetermined relation to the carrier frequency of a broadcast signal to which the receiver is tuned, and deriving a tuning signal that corresponds to said local signal;

applying said tuning signal in an adapter receiver having a tuning range that includes the carrier frequency of the broadcast signal to which the broadcast receiver is tuned;

acquiring the part of the broadcast signal in which said certain information is encoded by tuning the adapter receiver to receive the broadcast signal at said carrier frequency in response to said tuning signal; and decoding information contained in the part of said broadcast signal acquired by the adapter receiver.

5. The method of claim 4, including displaying information decoded from the acquired broadcast signal in the form of text characters.

6. The method of claim 4, including displaying information decoded from the acquired broadcast signal in the form of graphic images.

7. The method of claim 4, wherein the sensing step includes responding with the coupling means to an intermediate frequency (IF) signal emitted as the local signal from the broadcast receiver.

8. The method of claim 7, including arranging mixer circuit as part of the adapter receiver, and applying said tuning signal to the mixer circuit.

9. The method of claim 8, including performing said decoding step on a signal that is output from said mixer circuit.

10. The method of claim 4, including determining the frequency of said local signal.

11. The method of claim 10, including converting the determined frequency of said local signal to a tuning voltage, and said acquiring step includes tuning the adapter receiver to acquire the broadcast signal in response to said tuning voltage.

12. A wireless adapter for augmenting the operation of an existing broadcast receiver by decoding information contained in a broadcast signal to which the receiver is tuned, comprising:

coupling means for sensing a local signal emitted from a broadcast receiver in the vicinity of the coupling means, wherein the local signal has a predetermined relation to a carrier frequency of a broadcast signal to which the receiver is tuned, and the broadcast signal has certain information encoded in a part of the broadcast signal;

means for deriving a tuning signal that corresponds to the local signal; and adapter receiver means, including tuning means responsive to said tuning signal and having a tuning range that includes the carrier frequency of the broadcast signal to which the broadcast receiver is tuned, means associated with the tuning means for acquiring the part of the broadcast signal in which said certain information is encoded by tuning said tuning means to receive the broadcast signal at said carrier frequency in response to said tuning signal; and decoder means for decoding information contained in the part of the broadcast signal acquired by said tuning means.

13. A wireless adapter according to claim 12, including display means coupled to an output of said decoder means, for displaying decoded information in the form of text characters.

14. A wireless adapter according to claim 12, including display means coupled to an output of said decoder means, for displaying decoded information in the form of graphic images.

15. A wireless adapter according to claim 12, wherein said coupling means includes means for responding to an intermediate frequency (IF) signal emitted as the local signal from the broadcast receiver.

16. A wireless adapter according to claim 15, wherein said adapter receiver means includes a mixer circuit, and said tuning signal is coupled to the mixer circuit.

17. A wireless adapter according to claim 16, wherein said decoder means is arranged to respond to a signal that is output from said mixer circuit.

18. A wireless adapter according to claim 12, including means for determining the frequency of said local signal.

19. A wireless adapter according to claim 18, including means for converting the determined frequency of the local signal to a tuning voltage, and means for tuning said adapter receiver means to acquire the broadcast signal in response to said tuning voltage.

20. A wireless adapter according to claim 12, including antenna means coupled to said adapter receiver means, for responding to the broadcast signal acquired by said adapter receiver means, and said coupling means forms a part of said antenna means.

* * * * *